United States Patent [19]

Moslehi et al.

[11] Patent Number: 5,217,559

[45] Date of Patent: Jun. 8, 1993

[54] APPARATUS AND METHOD FOR IN-SITU DEEP ULTRAVIOLET PHOTON-ASSISTED SEMICONDUCTOR WAFER PROCESSING

[75] Inventors: Mehrdad M. Moslehi; Ajit P. Paranjpe, both of Dallas; Cecil J. Davis, Greenville, all of Tex.

[73] Assignee: Texas Instruments Incorporated, Dallas, Tex.

[21] Appl. No.: 625,186

[22] Filed: Dec. 10, 1990

[51] Int. Cl.$^5$ .............................................. H01L 21/00
[52] U.S. Cl. ................................... 156/345; 156/643; 118/722; 118/723
[58] Field of Search ................ 156/345, 643; 118/723, 118/722; 427/54.1

[56] References Cited

U.S. PATENT DOCUMENTS

| | | | |
|---|---|---|---|
| 4,454,835 | 6/1984 | Walsh et al. | 118/723 |
| 4,525,382 | 6/1985 | Sugioka | 118/723 |
| 4,687,544 | 8/1987 | Bersin | 156/345 |
| 4,718,974 | 1/1988 | Minaee | 156/345 |
| 4,910,436 | 3/1990 | Collins et al. | 118/50.1 |
| 5,030,475 | 7/1991 | Ackermann et al. | 427/54.1 |

FOREIGN PATENT DOCUMENTS 61-087317 5/1986 Japan .

OTHER PUBLICATIONS

"Photochemical cleaning & epitaxy of Si" by Y. Nara, T. Yamazaki, T. Sugii, R. Sugino, T. Ito and H. Ishikawa, *Advances in Semiconductor and Semiconductor Structure* given at SPIE Conference, Dec. 21, 1988.
"Epitaxial Growth of Ge Films on GaAs (285°-415°) by Laser Photochemical Vapor Deposition" by V. Tavitian, C. J. Kiely, D. B. Geohegan and J. G. Eden published in *Appl. Phys. Lett.* 52(20) 16 May 1988, p. 1710.
"Thin-Base Bipolar Technology by Low-Temperature Photo $\propto$ Epitaxy" by T. Sugii, T. Yamazaki, T. Fukano and T. Ito, source unknown.
"Photo Cleaning of Si Surface After Reactive Etching" by E. Ikawa, N. Aoto and Y. Kurogi, source unknown.
"Disilane Photo-Epitaxy for VLSI" by T. Yamazaki, T. Ito and H. Ishikawa-VSLI Symposium.
"Heavy Boron Doping in low-Temperature Si Photoepitaxy" by Yamazaki, Watanabe and Ito published *J. Electrochem Soc* vol 137, No. 1, Jan. 1990.

*Primary Examiner*—Brian E. Hearn
*Assistant Examiner*—George Goudreau
*Attorney, Agent, or Firm*—Stanton C. Braden; Richard L. Donaldson; William E. Hiller

[57] ABSTRACT

An in-situ deep-ultraviolet light generation module (126) for photon-assisted processing of semiconductor wafers (44) comprises a process environment space (152) for photochemical processing applications. Process gas injection space (182) receives reactive process gases and injects them into process environment space (152). Plasma fill space (124) receives a plasma (120) and may direct plasma (120) away from or into the process environment space (152) according to the presence or absence of control gas (160) flow. Control gas space (174) and flow/pressure switch space (154) receive control gas (160) to selectively permit deep-ultraviolet photons or plasma to reach process environment space (152) and interact with wafer (44) for photo-enhanced or plasma-enhanced wafer processing.

16 Claims, 6 Drawing Sheets

APPARATUS AND METHOD FOR IN-SITU DEEP ULTRAVIOLET PHOTON-ASSISTED SEMICONDUCTOR WAFER PROCESSING

TECHNICAL FIELD OF THE INVENTION

The present invention in general relates to semiconductor wafer processing, and more particularly to a method and apparatus for in-situ deep ultraviolet photon generation and photochemical processing of semiconductor devices.

BACKGROUND OF THE INVENTION

Integrated circuit chip manufacturers fabricate semiconductor devices by depositing, growing, and etching numerous layers of semiconductors, metals and insulating materials on a semiconductor wafer. Device processing involves placing the wafer within a processing reactor and exposing it to various process energy sources and reactive chemical compounds. The wafer processing equipment usually includes a process chamber in which the process energy sources affect the process environment and the semiconductor wafer. These process energy sources may include, for example, radiofrequency or microwave power sources for the generation of energetic metastables and ions in a process plasma, heat sources such as wafer heating lamps, and magnetron plasma sources. Another process energy or activation source that has numerous applications in low-temperature semiconductor device processing is ultraviolet (UV) light.

Nar, et al., "Photochemical Cleaning and Epitaxy of Si," SPIE Conference on Advances in Semiconductors and Semiconductor Structures, Dec. 21, 1988, describes a UV-assisted photochemical process for epitaxial growth of silicon. That paper presents reduced temperature processes for surface cleaning and epitaxial growth made possible by UV light irradiation of the process gases and semiconductor wafer surface. Through the use of UV irradiation, native oxide layers on silicon substrates can be removed at 730° C. and epitaxial silicon layers with high crystal quality can be deposited at a temperature as low as 540° C. in a disilane process ambient.

Both the photon energy (or light wavelength) spectrum and intensity of the deep UV energy source affect the kinetics or rate of a photochemical process. For a given set of process conditions, increasing the deep UV irradiation intensity also enhances the photochemical processing rate. The deep UV light sources used for photochemical device processing can be divided into two categories: broad-band sources with continuous and finite irradiation spectra, and narrow-band or monochromatic sources with distinct and well-defined (almost singlewavelength) emission lines. The deep UV light sources for photochemical processing usually operate at a single-wavelength or an irradiation band in the wavelength range of 100-400 nm. The photo enhancement of a deposition, etch, or surface cleaning process occurs either via photo-dissociation of a reactive process gas or photo enhancement of a surface-related process (reaction or desorption). The irradiation wavelength or spectrum must be optimized for a given process in order to effectively excite the gas molecules and/or activate the surface reaction/desorption. However, the photochemical processing systems proposed to date employ external UV sources, and are usually incompatible with other process energy sources such as a plasma. Moreover, most of these external and expensive light sources do not provide any wavelength tuning capabilities to optimize various photochemical processes.

Thus, there is a need for a method and apparatus that effectively and efficiently utilizes the advantages of ultraviolet light irradiation for semiconductor device fabrication and is compatible with additional process energy sources such as a plasma. Such a method may be used for removal of residual surface organic contaminants by ultraviolet/ozone cleaning, photochemical removal of metallic contaminants, photochemical etching, and low-temperature UV-assisted deposition applications.

Known methods of exposing a semiconductor wafer to UV photons require the use of an ex-situ deep ultraviolet energy source. The source emits deep ultraviolet photons, and irradiates the process environment and semiconductor wafer through a quartz window on the processing reactor. Several limitations are associated with the use of an external deep ultraviolet light source for semiconductor wafer photochemical processing. For example, an ex-situ deep ultraviolet photon source suitable for semiconductor wafer processing is rather expensive, takes up considerable space, and can limit the operational flexibility and ultimate throughput of a wafer production facility. Furthermore, the quartz window of the processing reactor attenuates the deep ultraviolet photon flux. Finally, formation of deposits on the quartz windows can further degrade UV light transmission and the photochemical process efficiency. Yet another drawback associated with the use of an ex-situ deep ultraviolet light source is that it consumes one available access port on the process chamber. As a result, the use of an external light source imposes a restriction on the process chamber design and implementation of any additional process energy sources such as a plasma. Moreover, process uniformity requirements in photochemical processing based on the use of external light sources usually impose a constraint on reactor and process chamber design. Optimum process uniformity typically requires that the semiconductor wafer be placed very close to the quartz window and the light source.

Thus, there is a need for an inexpensive ultraviolet photon source for efficient in-situ photochemical processing of semiconductor wafers.

There is a need for a deep ultraviolet photochemical energy source that does not occupy significant space in a wafer production facility.

There is a need for a deep UV photochemical energy source which provides capabilities for real-time adjustment and optimization of the UV irradiation spectrum and intensity.

Furthermore, there is a need for a deep UV photochemical process energy source that is fully compatible with existing plasma processing reactors and plasma process energy sources.

SUMMARY OF THE INVENTION

The present invention provides an apparatus and method for in-situ deep ultraviolet (UV) photon generation for semiconductor wafer processing that substantially eliminates or reduces disadvantages and limitations associated with prior deep ultraviolet photochemical processing apparatuses and methods. The apparatus of the present invention comprises a quartz module placed in a remote plasma processing reactor. The quartz module contains a region for in-situ deep ultraviolet light generation by afterglow emission from a remote microwave plasma stream, and a gas flow or pressure activated switch. The flow/pressure switch allows real-time selection of reactor operation either in the remote plasma processing mode or in the ultraviolet photon-enhanced device processing mode.

One aspect of the invention is an apparatus for in-situ generation of ultraviolet photons within a semiconductor wafer processing chamber. The apparatus comprises a module made of quartz or other transparent materials which fits within the reactor process chamber and incorporates a number of interconnected spaces or volumes flowing various gases. Spaces associated with the in-situ DUV module include a process environment space, a process gas injection space, a plasma fill space, and a control gas space. The process environment space contains a reactive gas or a plasma medium for semiconductor device processing. The process gas injection space receives a process gas and injects it into the process environment space. The in-situ DUV module also includes a plasma fill space that receives the plasma and can diffuse the plasma into the process environment space. Furthermore, the module includes a control gas space that receives a switch control gas to operate the flow/pressure switch. The module is designed so that the control gas actuates a pressure/flow switch that determines whether the plasma in the plasma fill space diffuses into the process environment space. When the flow/pressure switch prevents the plasma in the plasma fill space from entering the process environment space, ultraviolet photons emitted by radiative plasma emission still reach the wafer. When the flow/pressure switch allows the plasma to reach the wafer, the plasma medium interacts with the wafer.

Another aspect of the present invention is a method for controlled in-situ deep ultraviolet photon generation for photochemical enhancement of semiconductor wafer processing within a fabrication reactor. The method includes selectively directing process gases and a plasma into a process environment space near the semiconductor wafer. In the present invention, process gases flow via the process gas injection space into the process environment space which contains a semiconductor wafer. The present invention includes use of a control gas and an associated flow/pressure switch for selectively directing a process plasma either into the process environment space or away from the semiconductor wafer. The process plasma can generate a large amount of energetic ultraviolet photons via plasma afterglow emission for photochemical processing or a high concentration of activated metastable radicals and ions desirable for plasma-assisted semiconductor device fabrication. When only a large dose of deep ultraviolet photons is desired for photochemical processing, the flow/pressure switch is activated in order to prevent the plasma (optimized for DUV photon generation) from reaching the wafer and interacting with its surface. By varying the control gas flow rate, a variable fraction of the plasma species is allowed to diffuse to the semiconductor wafer surface.

The present invention eliminates the need for a separate, expensive, ex-situ deep ultraviolet energy source for photo-assisted semiconductor wafer processing. Thus, with the present invention, in-situ DUV photochemical processing of semiconductor wafers offers a number of advantages over the conventional ex-situ DUV processing techniques.

Another technical advantage of the present invention is that the in-situ DUV apparatus is fully contained within the process chamber walls and does not require additional space or physical port access in a semiconductor wafer processing reactor and production facility.

Another technical advantage of the present invention is that the amount of attenuation or loss of the ultraviolet photon flux is kept small from the point of DUV generation to the semiconductor wafer surface because the DUV photons do not have to travel through a thick quartz or sapphire optical/vacuum window on the chamber.

Yet another technical advantage of the present invention is that the energy source used for the deep ultraviolet photon generation is a remotely generated plasma stream. The plasma species may be generated by a remote microwave or a radio-frequency discharge plasma source. The same plasma source may also be used for plasma-enhanced processing (with suitable process gases) on a semiconductor wafer when the flow/pressure switch selects the plasma mode of operation. The present invention, therefore, uses the same process chamber port for access to the semiconductor wafer that a plasma energy source employs for plasma-assisted semiconductor device fabrication.

The present invention not only overcomes various limitations and expenses associated with prior external DUV light sources, but also includes additional technical advantages for in-situ multiprocessing. In the present invention, the microwave or radio-frequency (RF) plasma source for generating the process plasma can also generate a deep ultraviolet photon-emitting plasma when a suitable plasma gas medium is employed. Because the present invention does not require additional hardware or external components, yet another technical advantage of the present invention is that it is more reliable and simpler than known methods that use external deep ultraviolet light sources for photochemical device processing.

BRIEF DESCRIPTION OF THE DRAWINGS

The novel features believed characteristic of the invention are set forth in the appended claims. The invention itself, however, as well as modes of operation and accompanying advantages, are best understood by reference to the following description of illustrative embodiments when read in conjunction with the accompanying drawings.

DETAILED DESCRIPTION OF THE INVENTION

The embodiment of the present invention is best understood by referring to the FIGUREs of the drawings, like numerals being used for like and corresponding parts of the various drawings.

Figure 1:
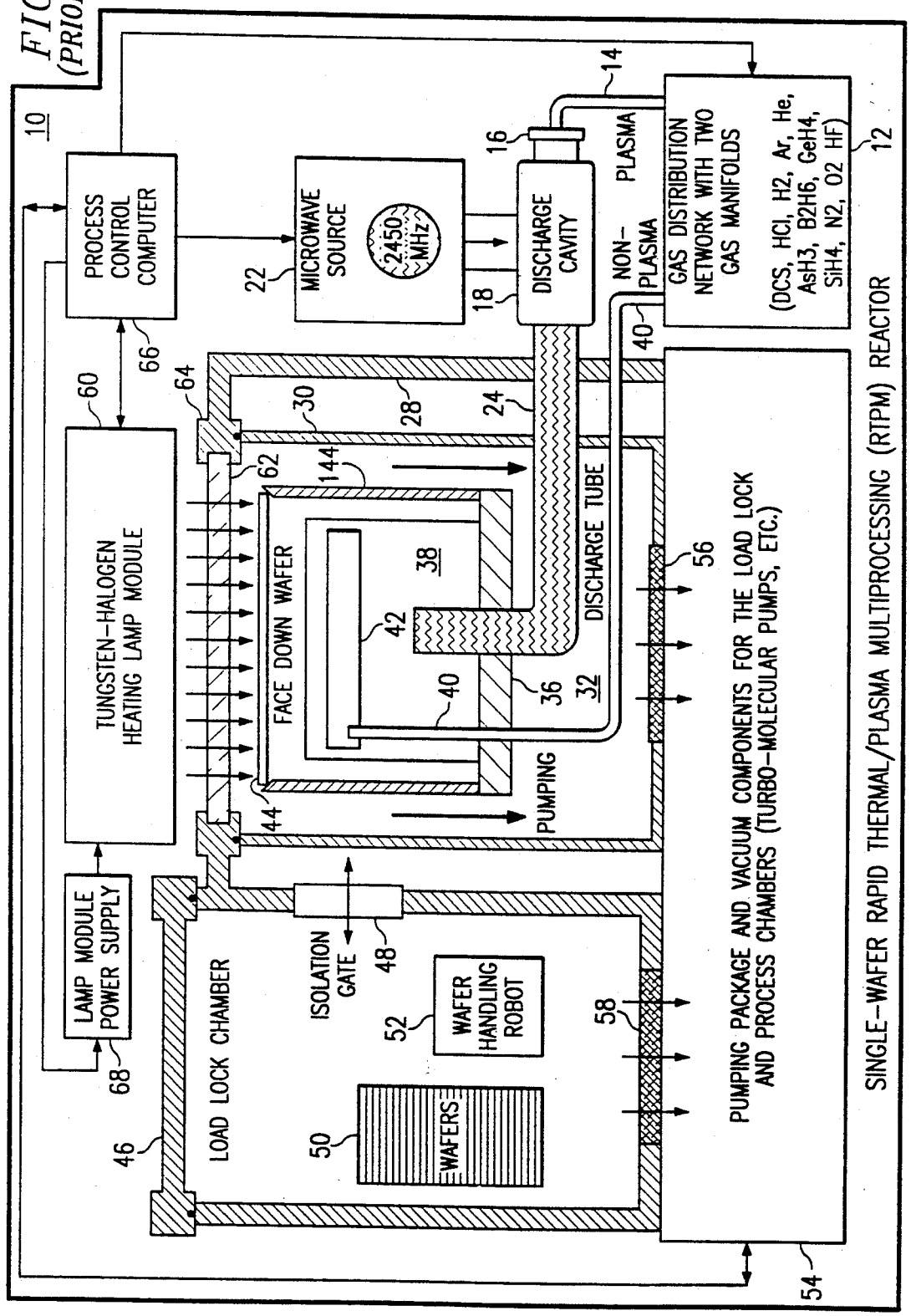
FIG. 1 is a schematic, partially broken away view of a single wafer thermal/plasma multiprocessing reactor that establishes the prior art for the present invention.

FIG. 1 shows a diagrammatic partially broken away view of a single-wafer rapid thermal/plasma multiprocessing reactor that establishes a representative example of the prior art for the present invention. The multiprocessing reactor 10 includes, at the bottom right corner of the drawing, gas distribution network 12 from which the plasma gas flows through channel 14 into discharge cavity inlet 16. Discharge cavity 18 contains a portion of the plasma discharge tube 24 which receives gas from inlet 16 and microwave power from microwave source 22 to generate plasma within discharge tube 24. Discharge tube 24 passes through reactor wall 28 and process chamber wall 30 into process chamber 32. From within reactor chamber 32, discharge tube 24 passes through ground or counter electrode 36 and into process chamber 38. Also beginning at gas distribution network 12, nonplasma process gas flows into process gas channel 40 which enters reactor chamber 32 through reactor wall 28 and process chamber wall 30. Within process chamber 32, process gas channel 40 travels through ground counter electrode 36 and into shower head or gas injection ring 42 which is directed towards face-down semiconductor wafer 44.

Load lock chamber 46 of multiprocessing reactor 10 includes isolation gate 48 through which wafers from cassette 50 are transferred one at a time into process chamber 32 using wafer handling robot 52. Pumping package and vacuum components 54 maintain low pressure within both process chamber 32 and load lock chamber 46 by pumping down these spaces through pump openings 56 and 58, respectively.

To control the temperature of face down semiconductor wafer 44 for processing, tungsten halogen lamp module 60 radiates optical energy through a quartz optical/vacuum window 62 held by mounting 64. Process control computer 66 provides control signals, including lamp power control signals to lamp module power supply 68, communications with tungsten halogen lamp module 60 and associated temperature sensors pumping package and vacuum controls to pumping package and vacuum components 54, and plasma generating control signals to microwave power source 22.

Figure 2:
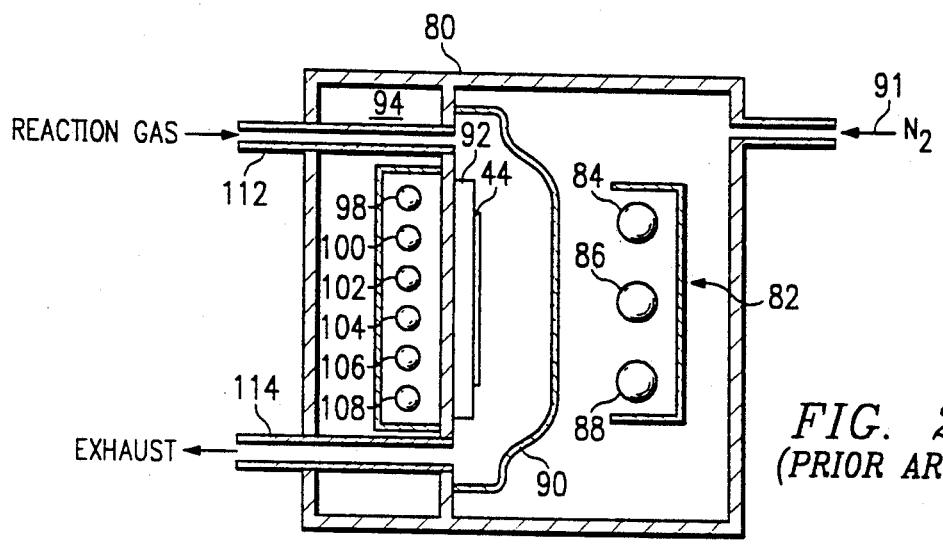
FIG. 2 illustrates a photochemical processing reactor consisting of an ex-situ deep ultraviolet photon source for low-temperature device fabrication typical of prior art devices.

FIG. 2 illustrates the known prior art method and typical apparatus for photochemical wafer processing using an ex-situ ultraviolet light energy source. According to FIG. 2, chamber 80 houses an ultraviolet lamp assembly 82 comprising a plurality of ultraviolet lamp sources 84, 86, and 88, which illuminates semiconductor wafer 44 with ultraviolet photon energy through quartz bell jar 90. Chamber 80 is purged at atmospheric pressure with nitrogen ($N_2$) at 91 for maximum photon energy transmission into quartz bell jar 90. Since the DUV light source 82 is placed outside the quartz process chamber 90, lack of $N_2$ purge would result in strong DUV photon absorption in the surrounding exposed air ambient due to ozone generation process. Semiconductor wafer 44 rests on susceptor 92 which connects to base 94. Base 94 contains an infrared heating lamp assembly 96 comprising a plurality of infrared heating lamp sources 98 through 108. The reaction gas for photochemical processing enters from a gas flow controller (not shown) into inlet 112 to fill quartz bell jar process chamber 90 and exits via exhaust line 114.

Some of the limitations associated with using the separate ex-situ or external ultraviolet lamp as shown in FIG. 2 are (i) the ultraviolet lamp 82 occupies already limited space within a semiconductor wafer fabrication clean room, (ii) the ultraviolet light intensity is attenuated by quartz bell jar 90, thereby reducing energy transmission from ultraviolet lamp 82 to semiconductor wafer 44, (iii) appropriate measures such as an $N_2$ purge are required in order to prevent strong DUV absorption in the gas ambient between the lamp and the bell jar, and (iv) in order to direct ultraviolet energy towards the surface of semiconductor wafer 44, one entire process chamber access port must be dedicated to the external DUV source. This configuration complicates the use of additional process energy sources such as a plasma in conjunction with the photochemical energy source. The apparatus of the present invention solves these problems and removes the abovementioned constraints.

Figure 3:
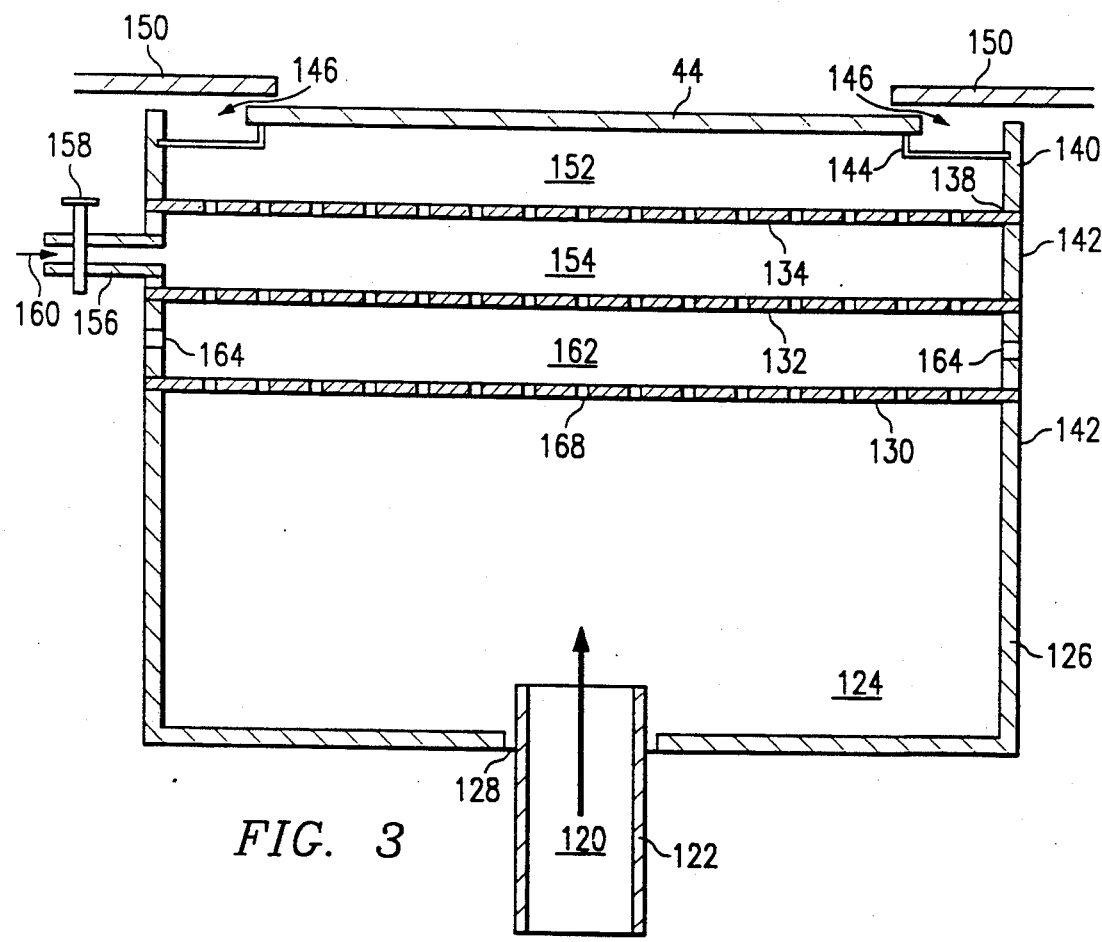
FIG. 3 is a side schematic view of the apparatus of the present invention.

FIG. 3 illustrates a conceptual side view of one embodiment of the present invention. Process plasma 120, generated by a remote microwave or radio-frequency plasma source, enters plasma fill space 124 of module 126 through process plasma tube outlet 122 Module 126 receives process plasma discharge tube outlet 122 through opening 128. Process plasma tube 122 essentially comprises a continuation of discharge tube 24 from discharge cavity 18. Module 126 is a cylindrical, piston-shaped, mostly-hollow volume configured to receive and guide a variety of gases. Module 126 includes lower perforated quartz plate 130, which is circular and attaches to the inner surface of module 126. Above lower quartz plate 130 is middle perforated quartz plate 132 which is also circular and engages the inner surface of module 126. Upper perforated quartz plate 134 also connects to module 126 at junction 138. Upper thin quartz plate 134 separates the upper cylindrical portion 140 of module 126 from the lower portion 142. Quartz plates 130, 132, and 134 contain arrays of holes with suitable sizing and concentration. Extending from module 126 are pins 144 which support facedown semiconductor wafer 44. Above semiconductor wafer 44 are purge spacers 150 separated by spacings 146.

Within module 126 and separated by thin quartz plates 130, 132, and 134 are a plurality of finite volume spaces. The process environment space 152 is bounded by semiconductor wafer 44 from above, thin quartz plate 134 from below, and upper module portion 140 cylindrically around the sides. Thin quartz plate 134 has a plurality of spaced holes that communicate between process environment space 152 and flow/pressure switch space 154. Flow/pressure switch space 154 is bound from above by thin quartz plate 134, from below by thin quartz plate 132, and around the sides by lower cylindrical portion 142 of module 126. Associated with flow/pressure switch space 154 is control gas inlet 156. Isolation on/off valve 158 controls the flow of a control gas 160 into flow/pressure switch space 154. Thin quartz plate 132, like thin quartz plate 134, comprises a plurality of spaced holes that permit flow of gases from flow/pressure switch space 154 into transition space 162.

Transition space 162 is bound from above by thin quartz plate 132 and from below by lower quartz plate 130. Lower portion 142 of module 126 also includes radial gas flow channels 164 that permit radial flow from transition space 162. Lower quartz plate 130 also includes a plurality of spaced holes 168 that permit flow of gases from plasma fill space 124 into transition space 162. Plasma fill space 124 is bound from above by lower perforated thin quartz plate 130, and from below and around its sides by the lower portion 142 of module 126.

While the present invention may be used for other processes, its advantages are apparent in its use for semiconductor wafer photochemical as well as plasma processing. Consequently, it is important to understand the photochemical enhancement effects in semiconductor processing. Photochemical processing has a number of important applications in microelectronic device fabrication. For instance, photo-enhanced low-temperature epitaxy can produce device-quality epitaxial silicon films at temperatures as low as 500° C. Ultraviolet irradiation enhances both vapor-phase dissociation and surface reactions involving disilane, including the adsorption of reactive species and the surface migration of adsorbed species. Depositing low-temperature photoepitaxial films, however, requires highly controllable impurity doping. In particular, a thin base for the high-speed bipolar devices requires heavy boron doping at a carrier concentration above $1 \times 10^{18}/cm^3$ with a very abrupt impurity profile and good crystal quality. In conventional thermal chemical vapor deposition epitaxy, relatively high growth temperatures of about 1000° C. are used. At these temperatures, heavy boron doping with abrupt boron profiles is difficult to achieve because the high epitaxial processing temperature causes significant boron diffusion.

Various features of plasma and photo-excited processes are compared in Table 1:

TABLE 1

|  | Plasma | Photo-Excited |
|---|---|---|
| Excitation Process | Electron-Assisted Dissociation and Ionization | Photon-Assisted Dissociation and and Surface Reaction |
| Reaction Species | Neutral Species and Ions | Neutral Species |
| Energy Distribution | Wide | Narrow |
| Incident Velocity | Charged Species Accelerated by Electric Field | Thermal Velocity |
| Possible Radiation Damage | High | Low |
| Process Control | Good | Excellent |

In a plasma process, the gas molecules are dissociated and/or ionized when they collide with electrons. Energetic ions accelerated by the self-induced electric field impinge on the semiconductor substrate and can cause irradiation damage to the devices (peak ion energies may be several hundred eV's). Moreover, because of the wide distribution of free electron energies in a plasma and the possible activation of multiple reactions at the same time, plasma processes provide limited capabilities for selective activation of a desired chemical reaction. However, in photochemical processes, the activated species are usually neutral radicals, unless high-energy (>10 eV) photon excitation is employed. Since the DUV light source used in the photochemical process can be monochromatic or narrowband, the desired chemical reaction may be easily activated by proper selection of the DUV wavelength and incident power. In order to select the wavelength of the DUV light source, that is, the type of the light source, it is necessary to have information about the photon absorption spectrum and the absorption coefficient of the reaction gas, as well as the photo-activation of surface-related processes such as surface reaction rate and desorption of the reaction by-products.

Various applications of photochemical processes have been demonstrated, such as epitaxial film growth, dielectric film deposition, metal film deposition, and etching. In these processes, ultraviolet light irradiation is used to decompose the reactive gases and/or activate the surface processes such as surface reaction and desorption. The reactions in the photochemical processes that are activated by UV irradiation may be characterized as follows:

(1) In the gas phase, the process gases may be excited and dissociated by the incident light to produce metastable radicals. The photo excitation process involves generation of electronic excited states by absorption of ultraviolet to vacuum ultraviolet light, as well as vibrational excited states by multi-photon absorption of lower energy photons.

(2) On the substrate surface, the substrate material (e.g. breakage of Si-Si bonds), desorption of the reaction by-products and/or the surface reaction process may be activated under ultraviolet light irradiation enhanced processing rate. Photo-assisted electron-hole pair generation in the substrate may also assist the surface reaction processes.

These reaction mechanisms are applicable to photochemical epitaxial growth of silicon as evidenced by various experimental results. In photochemical epitaxy, the selection of an appropriate DUV light source in conjunction with a proper reaction gas is most important. The absorption edge wavelengths of silane ($SiH_4$) and disilane ($Si_2H_6$) gases, which are commonly used for Si film deposition, are around 160 nm and 200 nm, respectively. Other epitaxial process source gases such as dichlorosilane ($SiH_2Cl_2$) have a much shorter absorption wavelength. The gas molecules are excited by absorption of the incident light photons with wavelengths shorter than the absorption edge of the process gas. The wavelength of a monochromatic light source or the irradiation spectrum of a broad-band DUV source must be selected to coincide with the absorption range of the process gas. Several light sources used in photochemical processes and their irradiation wavelengths are shown below:

| Light Source | Wavelength (nm) |
|---|---|
| Excimer Lasers | 193, 249, 308 |
| Ar-Ion Laser | 488, 515 |
| Mercury Lamp | 185, 254 |
| Rare Gas Lamp | 107, 124, 147 |
| Microwave Discharge | Broadband |

The mercury lamp is suitable for many photochemical processing applications, which require uniform high-intensity irradiation over a large substrate area. Moreover, disilane, which effectively absorbs the 185 nm light from mercury lamps, is a suitable silicon source gas for photo-enhanced deposition of epitaxial silicon, amorphous silicon, and polysilicon films.

For low temperature epitaxial growth, it is important to activate the deposition reaction by DUV irradiation because thermal activation effects are small in the low temperature regime. At least a fraction of the incident ultraviolet light must reach the substrate surface in order to activate the surface reduction reaction.

Removal of the native oxide and contaminants from the substrate surface is essential before epitaxial growth. This can be accomplished by ultraviolet irradiation in $H_2$ gas ambient. Effectiveness of this surface cleaning approach may be evaluated via the crystal quality of the epitaxial films. Nar, et. al., "Photochemical Cleaning and Epitaxy of Si," SPIE Conference on Advances in Semiconductors and Semiconductor Structures, Dec. 21, 1988 (hereafter "Nar") shows that ultraviolet irradiation reduces the threshold temperature for surface cleaning to 810° C. at 26.6 kPa and 730° C. at 2.66 kPa, compared to around 900° C. without ultraviolet irradiation. These experimental results show that ultraviolet irradiation of the semiconductor substrate during the pre-cleaning process activates the removal of the surface native oxide and lowers the necessary surface cleaning temperature.

Silicon films may also be epitaxially grown after surface cleaning in the same process chamber. Epitaxial growth at 540° C. was accomplished with ultraviolet irradiation by Nar. In the temperature range from 650° C. to 800° C., the growth rate with ultraviolet irradiation was five times that without ultraviolet irradiation. Below 650° C., the growth rate was independent of the substrate temperature with ultraviolet irradiation, and there was no significant film deposition without ultraviolet light irradiation. Ultraviolet light irradiation in the high temperature region seems to enhance reactions on the silicon substrate surface, such as the surface migration of absorbed species and the desorption of surface reaction by-products. In the low-temperature region, generation of the photochemically produced radicals in the gas-phase is enhanced by the ultraviolet light irradiation.

Figure 4:
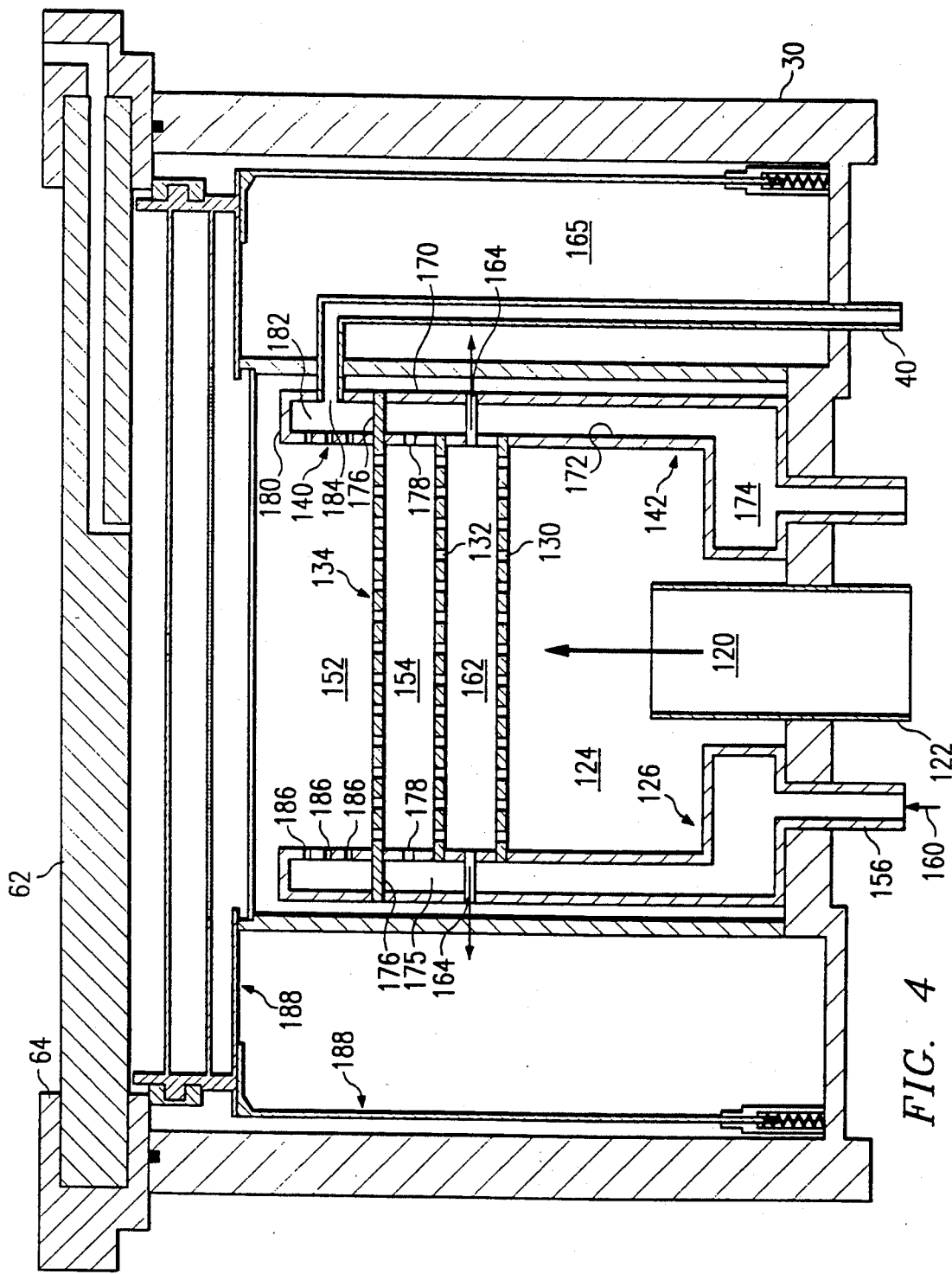
FIG. 4 is a side schematic view of a preferred embodiment of the present invention within a semiconductor wafer process chamber.

FIG. 4 illustrates an embodiment of the present invention in a semiconductor wafer process chamber. In FIG. 4, process plasma 120 enters plasma fill space 124 via process plasma inlet 122. Lower thin quartz plate 130 and middle thin quartz plate 132 connect to lower portion 142 of module 126. Upper thin quartz plate 134 attaches to upper portion 140 of module 126. In addition to the elements that FIG. 3 describes, module 126 of the embodiment of FIG. 4 also includes an outer module wall 170. Outer module wall 170 surrounds inner module wall 172 to form control gas space 174. Upper control gas space 175 is bound at the upper portion by extension 176 of upper quartz plate 134. Radial gas flow channels 164 from transition space 162 penetrate through control gas space 174 and connect the transition space 162 to the annular pumping space 165 within the process chamber. Radial gas flow channels 164 do not, however, block control gas space 174 and allow flow of the control gas from the lower control gas space 174 to the upper control gas space 175.

Control gas space 174, 175 also contains holes 178 that permit control gas to flow radially inward to flow/pressure switch space 154. Coaxial to the outer module wall 170 of control gas space 174 is upper outer wall 180, which surrounds upper portion 140 both above and along the sides to create process gas injection space 182.

Process gas injection space 182 includes process gas inlet 184 through which process gases from process gas channel 40 enters process chamber. Process gas injection space 182 also includes process gas injection holes 186 that permit flow of process gases into process environment space 152 below semiconductor wafer 44.

Also shown in FIG. 4 is purge module 188 which is not essential to the present invention; however, it can be used in conjunction with the in-situ deep ultraviolet photon generating source of the present invention. The technical aspects of purge module 188 are described in U.S. patent application, Ser. No. 634,676, filed Dec. 27, 1990, by Messrs. Moslehi, et al. Because of the relation between purge module 188 and the present invention, the disclosure of that application is herein incorporated by reference.

Control gas 160 (which enters control gas space 174 at the bottom of module 126 in FIG. 4 as opposed to the left side in FIG. 3) operates as a switch either to permit process plasma 120 to reach semiconductor wafer 44 or prevent plasma 120 reaching semiconductor wafer 4 within process chamber 30. When control gas 160 is directed through control gas inlet 156 to lower control gas space 174, it fills that space and upper control gas space 175 and flows through holes 178 into flow/pressure switch space 154. Upon filling flow/pressure switch space 154, control gas 160 flows axially into transition space 162 and into process environment space 152 through holes in quartz plates 132 and 134. This control gas flow blocks flow of plasma 120 upward to semiconductor wafer 44. Because of this increased flow impedance, the plasma in transition space 162 is not able to easily pass through thin quartz plate 132 and so flow occurs outward radially through radial gas flow channels 164, and into the outer sides 165 of module 126 from which it is pumped out. As a result, most of the ultraviolet photon-generating plasma from plasma fill space 124 does not reach semiconductor wafer 44. However, a fraction of activated plasma 120 may still reach the semiconductor wafer 44 due to the nonideal characteristics of the flow/pressure switch.

The present invention permits reactor 10 to operate in two discrete modes: a plasma processing mode and an in-situ photochemical processing mode. The in-situ photoassisted processing mode is appropriate for photochemical processing of semiconductor wafer 44. For example, it is possible to perform photochemical surface cleaning by injecting ozone through process gas injection space 182 into process environment space 152. In-situ photochemical surface cleaning is then performed via in-situ deep ultraviolet light generation using a suitable plasma in the plasma fill space 124 and suppressing the flow of photon-producing plasma to the wafer 44 by activating the flow/pressure switch. Since the remote plasma may be either a microwave or a radio-frequency discharge process energy source, a wide variety of plasma-enhanced and photon-enhanced semiconductor device processing applications are possible. Examples of inert gases that can be used to produce a relatively intense ultraviolet light include helium, argon, and xenon (or mixtures of noble gases). Moreover, other plasmas consisting of nitrogen and other non-inert gases as well as their mixtures with inert gases may be used. There are other choices, but these gases are preferred for the preferred embodiment of the invention.

In the preferred embodiment of the present invention, module 126, and thin plates 130, 132, and 134 are made of optical grade quartz material. This minimizes any detrimental interaction between the activated plasma species and the in-situ DUV module for most types of ultraviolet photon-generating plasmas. However, it is not desirable to use plasma producing gases containing fluorine, because fluorine may attack quartz. Other optical materials such as sapphire may be used instead of quartz.

When using an ultraviolet photon-generating plasma for photochemical processing, control gas 160 enters flow/pressure switch space 154 so that the plasma from plasma inlet 122 can only fill plasma fill space 124 and transition space 162. Consequently, plasma fill space 124 acts as a deep ultraviolet photon emission source, resulting in DUV irradiation of wafer and process environment. The deep ultraviolet photons travel through thin quartz plates 130, 132, and 134 and reach the surface of semiconductor wafer 44. This can be done while the plasma 120 is prevented from reaching the wafer 44.

By varying the flow rate of control gas 160, a predetermined portion of process plasma 120 may be permitted to reach semiconductor wafer 44. In transitioning from a fully plasma-assisted process to a photochemical process based on ultraviolet photons, such variable control may be useful. There may be other advantages to variably controlling the rate of control gas 160 flow into flow/pressure switch space 154. One potential application is hybrid or mixed-mode wafer processing by a combination of in-situ ultraviolet light irradiation and a plasma. Such variable control would clearly be within the scope of the present invention.

Figure 5:
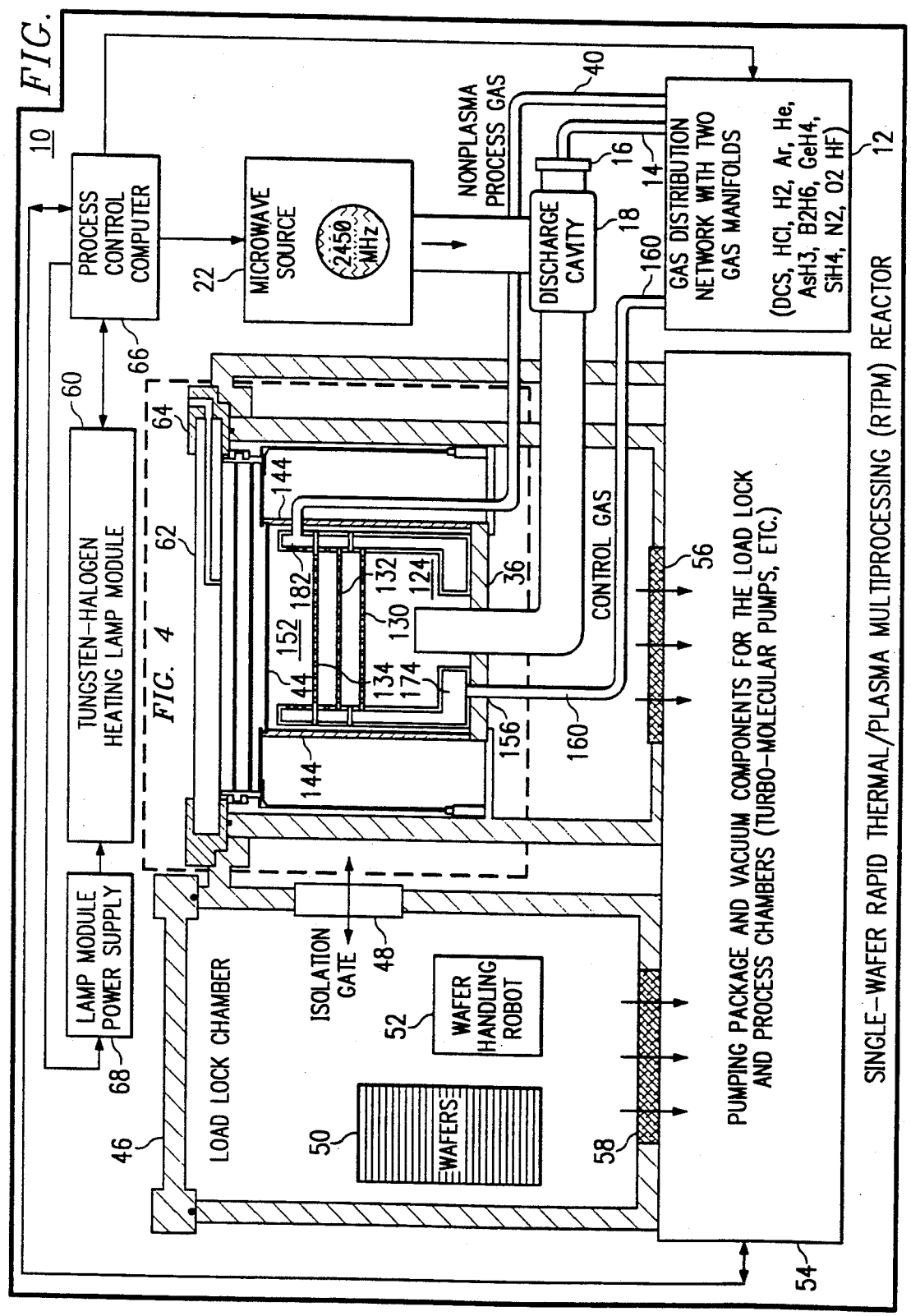
FIG. 5 is a diagrammatic partially broken away view of a single-wafer thermal/plasma multiprocessing reactor including the embodiment of the present invention of FIGURE 4.

FIG. 5 is similar to the partially broken away diagrammatic view of FIG. 1, but shows the embodiment that FIG. 4 illustrates replacing the conventional apparatus within the process chamber. This illustrates the placement of the present invention within multiprocessing reactor 10. Note that in the embodiment of FIG. 5, process gas channel 40 continues within process chamber 32 to provide process gas to process gas injection space 182. In the embodiment of FIG. 5, control gas inlet 156 penetrates ground electrode 36 and provides control gas 160 to control gas space 174. No substantial modification to process plasma inlet 122 is necessary in the present invention.

Figure 6:
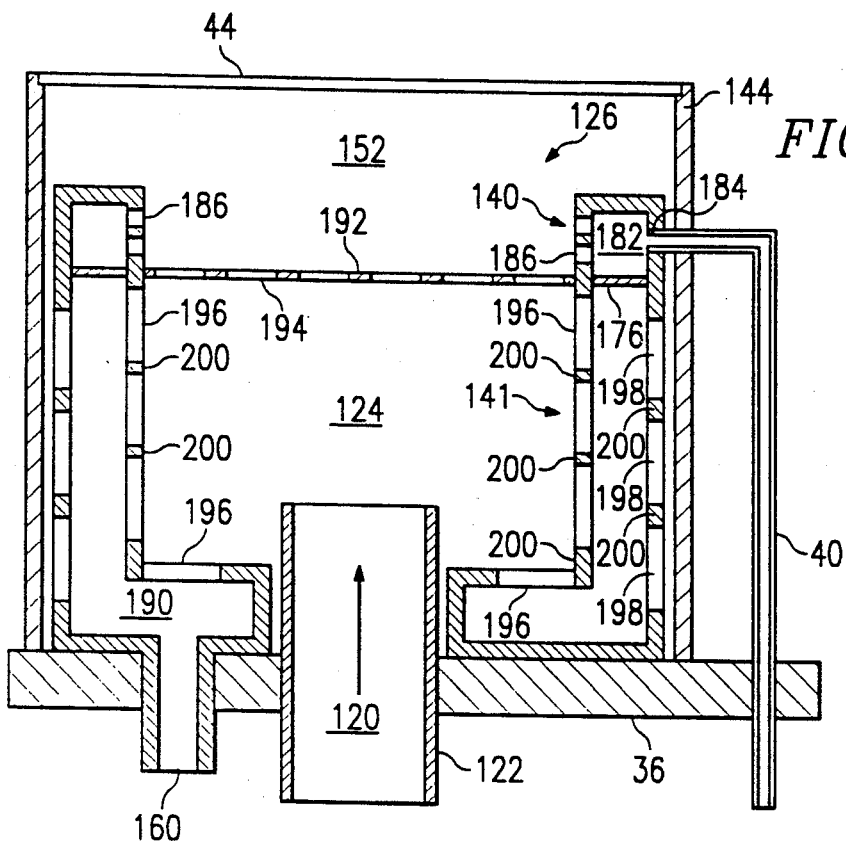
FIG. 6 is a side schematic view of an alternative embodiment of the present invention.

FIG. 6 illustrates an alternative embodiment of the present invention. According to FIG. 6, process plasma 120 enters through process plasma inlet 122 at ground electrode or support plate 36 and fills plasma fill space 124. The present invention includes upper portion 140 and process gas injection space 182 which is separated by spacer 176 from control gas space 190. Control gas space 190 is bounded from above by spacer 176, and from below and along the two sides by quartz walls 200. The quartz plate 194 of module 126 provides a boundary for the plasma fill space 124. Unlike control gas space 174 of FIG. 4, control gas space 190 includes a plurality of openings or holes 196 on the module 126 portion along the sides and the base of module 126. On the outer perimeter of control gas space 190 appear openings 198 on the quartz walls 200. Process gas inlet 184 connects to process gas injection space 182. In the FIG. 6 embodiment, thin quartz plates 130, 132, and 134 of FIGS. 3 through 5, are replaced by a single thin quartz plate 192 having holes 194. This plate 192 separates the plasma fill space 124 from wafer process space 152.

The operation of the embodiment of FIG. 6 is similar to that of the embodiment described in FIGS. 3 through 5. In the operation of the FIG. 6 embodiment, plasma flowing from process plasma inlet 122 fills plasma fill space 124 and is directed away from wafer 44 by flowing radially through side holes 196 when control gas 160 is not present. As a result, process plasma 120 does not flow through thin quartz plate 192, and is instead pumped out from process chamber 32. This condition occurs when no control gas flows into control gas space 190 because the net radial flow conductance for openings 196 is much larger than the axial flow conductance through holes 194 of plate 192. In this mode of operation, deep ultraviolet photons are generated in the plasma fill space 124 and irradiate semiconductor wafer 44 through plate 192 without the flow of photon-generating plasma towards wafer 44. When control gas 160 flows into control gas space 190, it impedes radial flow of process plasma 120 through openings 196 and 198 from plasma fill space 124. The control gas 160 flow into control gas space 190 results in an effective reduction of flow conductance for plasma flow in the radial direction. Consequently, by appropriately sizing holes 194, 196 and 198, process plasma 120 can reach semiconductor wafer 44. Thus, process plasma 120 from process plasma inlet 122 is decoupled from semiconductor wafer 44 when control gas 160 is not introduced into control gas space 190. On the other hand, when control gas 160 is introduced into control gas space 190, process plasma 120 is coupled with semiconductor wafer 44. In essence, therefore, the operation of the FIG. 6 embodiment is reversed from that of the embodiment of FIGS. 3 through 5. (Activation of the flow/pressure switch directs plasma towards wafer for plasma processing).

In the embodiment of FIG. 6, the size and number of holes is selected so that approximately 80 percent of the plasma exits through the inner and outer boundaries of control gas space 190, and only about 20 percent goes through the plate toward the semiconductor wafer 44 in the absence of control gas 160. The material of the FIG. 6 embodiment, like that of the FIGS. 3 through 5 embodiment, is preferably quartz. Other materials such as sapphire and combination of quartz and sapphire may also be used. The gases for ultraviolet in-situ photon generation are, for example, helium, other inert gases, mixtures of an inert gas with nitrogen, and various other gases.

In comparing the performance of the embodiment of FIGS. 3 through 5 to that of FIG. 6, it has been determined that the FIG. 6 embodiment allows the use of lower control gas 160 flow rates to activate the flow/pressure switch. As an example, for a process plasma 120 flow rate of less than 20 sccm through process plasma inlet 122 in the FIG. 4 embodiment, it may be necessary to have as much as 200 sccm of control gas flow through the flow switch. Consequently, there is the possible need for a large pumping capacity to evacuate both process plasma 120 and control gas 160 through radial gas flow channels 164. This may dilute the process gases in the process environment space 152 and adversely affect some photochemical processes.

Another difference in the FIG. 6 embodiment, is that the flow resistance through thin quartz plate 192 is less than the combined resistance of thin quartz plates 130, 132, and 134 in the FIG. 4 embodiment. As a result, when operating in plasma processing mode, a greater percentage of the activated species in the process plasma can reach the semiconductor wafer 44 in the embodiment of FIG. 6. On the other hand, the FIG. 6 embodiment may permit more back diffusion of process gases into plasma flow space 124 and into process plasma inlet 122. This may adversely affect UV generation. Thus, there are various tradeoffs between the respective embodiments.

Figure 7:
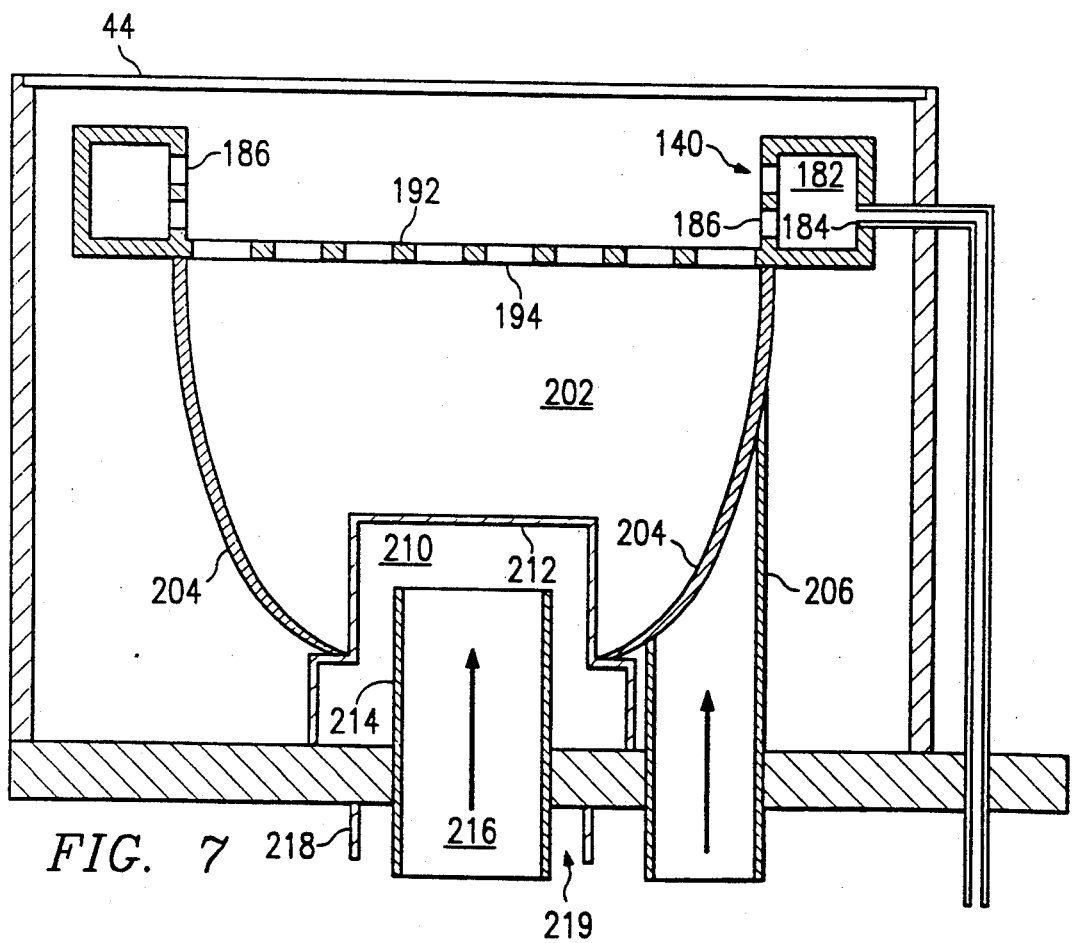
FIG. 7 is yet another alternative embodiment of the present invention.

FIG. 7 shows yet another embodiment of the present invention. According to FIG. 7, a portion of the in-situ ultraviolet photon generating module of the present invention is similar to previous embodiments, including thin perforated quartz plate 192 with holes 194. Thin quartz plate 192 connects to upper portion 140 which process gas injection space 182 surrounds. Process gas injection space 182 has process gas injection holes 186 and process gas inlet 184. Beneath thin quartz plate 192 is plasma fill space 202. Lower portion 202 is a bowl or paraboloid shaped structure having a mirrored or silvered surface 204. The embodiment of FIG. 7 also includes plasma inlet 206 to receive process plasma within plasma fill space 202. Isolated from plasma fill space 202 is ultraviolet photon-generating space 210. Separator 212 (made of a transparent material such as quartz or sapphire) surrounds ultraviolet photon-generating space 210. Within ultraviolet photon-generating space 210 is ultraviolet photon-generating plasma inlet 214 for receiving ultraviolet photon-generating plasma 216. Outlet 218 surrounds ultraviolet photon-generating plasma inlet 214 and receives effluent from ultraviolet plasma fill space 210 for subsequent pump out through the annular space 219 between outlet 218 and plasma inlet 214.

The embodiment of the present invention in FIG. 7 provides in-situ deep ultraviolet photon transmission, but does not use a control gas or a flow/pressure switch. In the embodiment of FIG. 7, there are two independent plasma sources. One source flows through plasma inlet 206 through an opening into plasma fill space 208. The other source is isolated from plasma fill space 208 and flows through ultraviolet photon source space 202. As a result, the plasma gas that the FIG. 7 embodiment uses for in-situ deep ultraviolet photon generation is completely isolated from process plasma and does not interact with the process environment. An advantage of the embodiment of FIG. 7 is that it is possible to operate completely in a plasma-assisted mode, or completely in a deep ultraviolet photon-assisted photochemical processing mode, or in a combined mode.

For example, it is possible to introduce a process plasma through plasma inlet 206 into plasma fill space 202. The plasma then diffuses into process environment space 152. Alternatively, a deep ultraviolet photon-generating plasma 216 may be guided into ultraviolet photon-generating source space 210 to generate controlled deep ultraviolet photons to irradiate wafer 44. The embodiment of FIG. 7, additionally, may operate in both the plasma-assisted mode and in a controlled ultraviolet photon assisted mode, so that a semiconductor wafer may receive both a large quantity of deep ultraviolet photons from ultraviolet photon-generating source space 210, as well as process plasma from plasma fill space 202. Also, independent control of the UV generating plasma, and the process plasma in terms of gas composition, gas pressure, flow rate, and discharge power is possible for optimal operation. Back diffusion of process gases into the UV source space 210 is not possible since the space is completely sealed from the process environment 152. The paraboloidal silvered walls 204 enhance the uniformity and intensity of UV radiation incident on the wafer. The process plasma transmission efficiency from plasma fill space 202 into process environment space 152 is higher than the embodiments described in FIGS. 3-6.

A difference between the FIG. 7 embodiment and the embodiments of FIG. 4 and 6, however, is additional complexity in terms of plasma source hardware implementation. With the embodiment of FIG. 7, it is necessary to use two separate plasma sources and two separate remote discharge sources. Thus, while the embodiment of FIG. 7 overcomes many of the limitations associated with ex-situ ultraviolet photon generation, it has some limitations. These limitations, however, may be outweighed by the various modes of operation and its operational flexibility.

Figure 8:
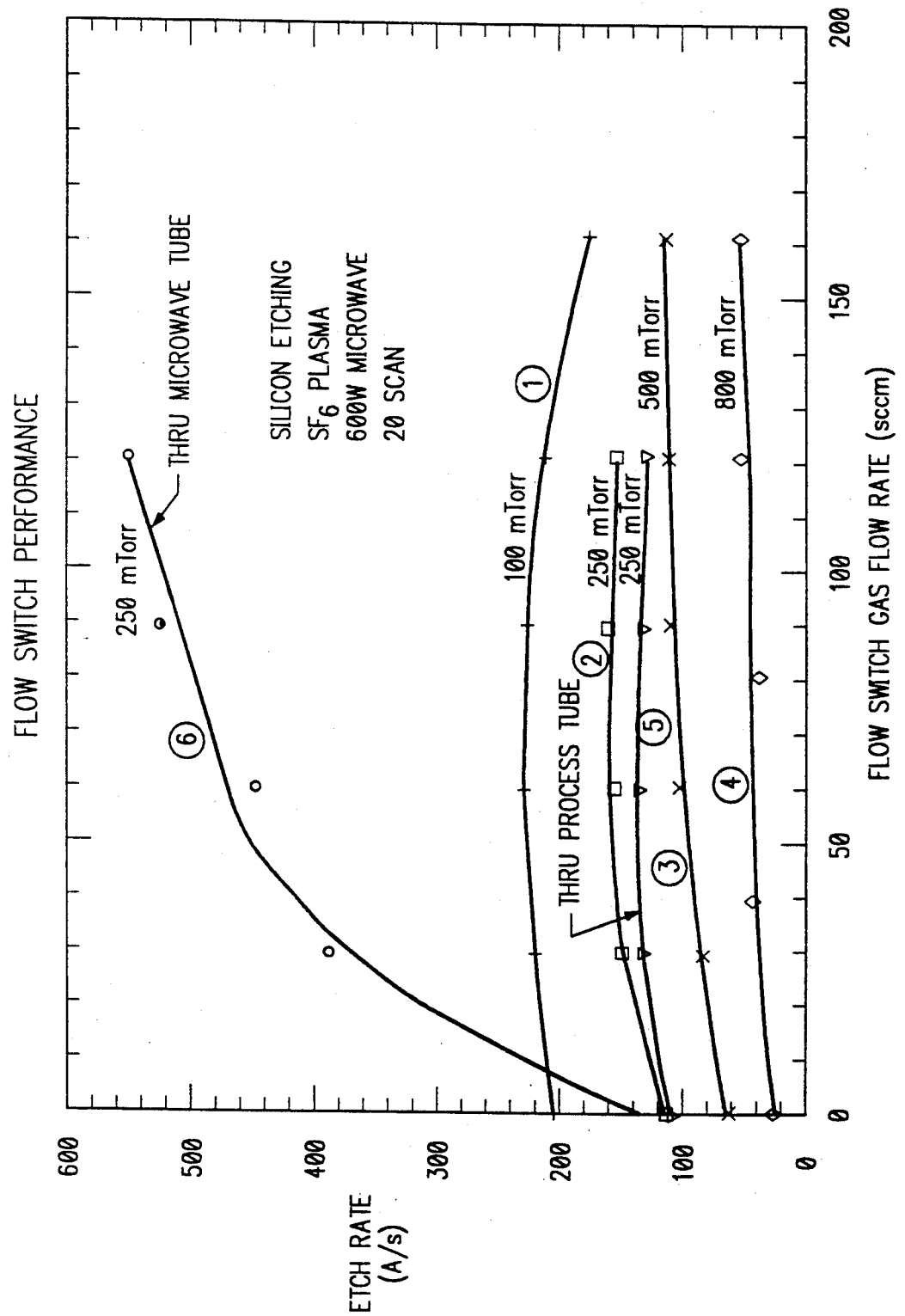
FIG. 8 is a graph showing the performance of the flow switch for a prototype in-situ DUV generation module.

FIG. 8 shows the results of a test for assessing the performance of the flow switch for a prototype module based on the design described in FIG. 6. The test was based on Si etching using a remote microwave $SF_6$ plasma. The process gas is dissociated by the plasma, and the resulting F atoms are responsible for Si etching. The microwave power was fixed at 600 W, and the flow rate of $SF^\circ$ plasma gas through the plasma inlet was 20 sccm. The control gas flow rate was varied from 0–160 sccm and the pressure from 100–800 mTorr. The objective of the experiment was to check if the Si etch rate increases with increasing control gas flow rate. The control gas was also chosen to be $SF_6$.

If the flow switch were operating properly, the etch rate ought to increase with increasing control gas flow rate, since a larger fraction of the plasma (metastables, ions and radicals) are directed towards the wafer. However, for very high control gas flow rates, some of the control gas enters the process environment, thereby diluting the constituents in the process environment, with a concomitant reduction in etch rate. Curves 1 through 4 in FIG. 8 exhibit all these characteristics. For moderate control gas flow rates, part of the etch rate enhancement is due to diffusion of control gas into the plasma fill space resulting in the formation of additional F atoms. To assess the effect of diffusion on the enhancement of etch rate, experiments were performed in which the control gas was introduced either through the process gas inlet (curve 5 in FIG. 8) or through the plasma gas inlet (curve 6 in FIG. 8). Both these curves show that the etch rate is enhanced by introducing control gas, even though the control gas is not necessarily introduced through the control gas inlet. However, introducing the control gas through the control gas inlet is more effective than introducing it through the process gas inlet. Thus in the prototype design the flow switch does operate, but its performance is not optimized for the data in FIG. 8.

Based on these preliminary results a model for operation of the flow switch was formulated. The prototype design considered convective flows alone; the model indicated that at the intended pressure of operation, diffusive fluxes need to be comprehended in the design. A revised design that considers both convective and diffusive terms will provide improved performance.

Although the invention has been described with reference to the above specific embodiments, this description is not meant to be construed in a limiting sense. Various modifications of the disclosed embodiments, as well as alternative embodiments of the invention will become apparent to persons skilled in the art upon reference to the above description. It is therefore contemplated that the appended claims will cover such modifications that fall within the true scope of the invention.

What is claimed is:

1. An apparatus for in-situ photon-assisted semiconductor device processing in a plasma processing reactor, comprising:
   a module for placement in the wafer processing reactor, said module comprising photon-transmissive material, and a plasma fill space for receiving a photon-producing plasma; and
   a flow/pressure switch space associated with said plasma fill space for selective guidance of said process plasma or said plasma-generated photon towards the semiconductor wafer.

2. The apparatus of claim 1, wherein said module further comprises a material transmissive to ultraviolet photons and said plasma fill space is further capable of receiving an ultraviolet photon-producing plasma.

3. The apparatus of claim 2, wherein said module further comprises a plurality of apertures, said apertures for permitting flow of a plasma from said plasma fill space to the semiconductor wafer.

4. The apparatus of claim 1, wherein said plasma fill space associates with the wafer processing reactor to selectively receive a photon-producing plasma or a process plasma.

5. The apparatus of claim 1, wherein said module further comprises a control gas space for receiving a control gas and directing said control gas to said flow/pressure switch space to control flow f plasma to the wafer.

6. The apparatus of claim 1, wherein said module further comprises a transition or buffer space for permitting plasma to selectively flow to the semiconductor wafer.

7. The apparatus of claim 1, wherein said photon-producing gas comprises a deep ultraviolet-light emitting plasma generated from a remote plasma discharge device.

8. The apparatus of claim 2, wherein said photon-producing gas comprises an inert gas plasma generated from a remote plasma discharge device.

9. The apparatus of claim 1, wherein said photon-producing gas comprises an inert gas/nitrogen plasma mixture generated from a remote plasma discharge device.

10. The apparatus of claim 1, wherein said module further comprises a process gas injection space for directing additional process gases to the semiconductor wafer.

11. An apparatus for in-situ photon-assisted semiconductor device processing in a plasma processing reactor, comprising:
    a module for placement in the wafer processing reactor, said module comprising photon-transmissive material, and a plasma fill space for receiving a photon-producing plasma; and
    a control gas space for receiving a control gas, said control space associated with a flow/pressure switch to control flow of plasma to the wafer as a function of receiving said control gas.

12. An apparatus for in-situ generation of ultraviolet photons to process a semiconductor wafer within a semiconductor wafer processing reactor, comprising:
    a module for housing a plurality of spaces associated for selectively receiving various plasmas and gases, said module comprising a light emission space and a photon transmissive material and said plurality of spaces comprising:
    a process environment space for containing a gas medium for processing the wafer;
    a process gas injection space for receiving a process gas and associated to inject said process gas into said process environment space;
    a plasma fill space for receiving a plasma and associated to permit either flow of said plasma or emission of said ultraviolet photons into said process environment space; and
    a control gas space for receiving a control gas, said control gas associated with said plasma fill space for selectively controlling flow of said plasma into said process environment space.

13. The apparatus of claim 12, wherein said module comprises a cylindrical quartz container and said plurality of spaces comprise associated compartments within said container.

14. The apparatus of claim 12, further comprising a flow/pressure switch space associated for receiving said control gas from said control gas space and positioned between and associated with said plasma fill space and said process environment space for controlling flow of said plasma between said plasma fill space and said process environment space.

15. The apparatus of claim 12, wherein said control gas space comprises a control gas inlet for selectively directing control gas into said module.

16. The apparatus of claim 12, wherein a quartz plate separates said process environment space from said plasma fill space, said quartz plate comprising a plurality of apertures to allow flow of said plasma form said plasma fill space to said process environment space.

* * * * *